United States Patent [19]
Schloetterer
[11] 3,919,766
[45] Nov. 18, 1975

[54] METHOD FOR THE PRODUCTION OF INTEGRATED CIRCUITS WITH FIELD EFFECT TRANSISTORS OF VARIABLE LINE CONDITION

[75] Inventor: Heinrich Schloetterer, Putzbrunn-Solalinden, Germany

[73] Assignee: Siemens Aktiengesellschaft, Berlin & Munich, Germany

[22] Filed: Mar. 28, 1974

[21] Appl. No.: 455,591

[30] Foreign Application Priority Data
Mar. 30, 1973 Germany ............................ 2316096

[52] U.S. Cl. ..................... 29/571; 148/191; 357/41; 29/578
[51] Int. Cl.² ........................................... B01J 17/00
[58] Field of Search .............. 29/571, 578; 148/191; 357/41, 42, 73

[56] References Cited
UNITED STATES PATENTS
3,673,679 7/1972 Carbajal ............................... 29/571
3,783,052 1/1974 Fisher ................................ 148/191

OTHER PUBLICATIONS
RCA–Technical Notes, TN No. 891, Greig & Jackson, June 21, 1971.
IBM Technical Disclosure Bulletin, Vol. 11, No. 4, Sept. 1968, p. 397, Statz.

*Primary Examiner*—W. Tupman
*Attorney, Agent, or Firm*—Hill, Gross, Simpson, Van Santen, Steadman, Chiara & Simpson

[57] ABSTRACT

Method of producing integrated circuits with field effect transistors of variable line condition which includes gettering a semiconductor member in a region where one transistor is to be formed to reduce its doping concentration and protecting another region of the semiconductor member from being gettered while the first region is being formed, where another field effect transistor is to be formed. The resulting field effect transistors require different starting potentials, although their respective channels have the same type of doping.

8 Claims, 5 Drawing Figures

METHOD FOR THE PRODUCTION OF INTEGRATED CIRCUITS WITH FIELD EFFECT TRANSISTORS OF VARIABLE LINE CONDITION

BACKGROUND OF THE INVENTION

Integrated circuits with field effect transistors of different conductivity condition are known. They may be produced, for instance, by using various gate insulators or various gate electrodes. However, it is believed that these known arrangements made extremely strict demands on their production. It is an object of the present invention to provide an integrated circuit with field effecto transistors of different conductivity condition which may be formed by a novel method which is economical and which provides highly satisfactory results.

BRIEF SUMMARY OF THE INVENTION

The present invention provides a means for forming a pair of field effect transistors in a semiconductor body in which the channels of the two transistors have the same type impurities but of different concentration. This is obtained by a novel gettering process. Basically, the present invention provides a process in which a silicon layer, having a dopant of a type which is desired for the channels of two or more field effect transistors of the MOS type, is partially covered with a pyrolytically deposited layer of silicon nitride and partially covered with a layer of a gettering material such as a thermic silicon oxide. Beneath the gettering layer, the concentration of the impurities in the silicon body is reduced, while below the protective layer substantially no reduction in concentration occurs. Field effect transistors are then formed in these two regions by diffusing opposite type dopant thereinto to provide source and drain regions for each transistor. The resulting transistors have different threshold voltages.

DETAILED DESCRIPTION

Figure 1:
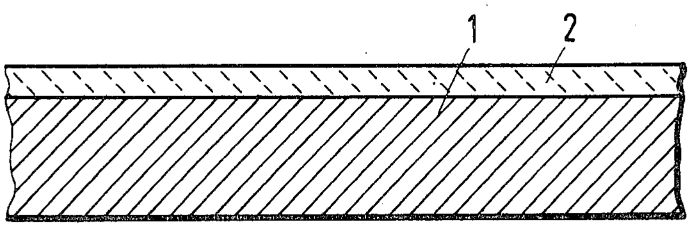
FIGS. 1 to 5 of the drawings diagrammatically illustrate partial sectional views of the successive steps of the present invention.
Figure 2:
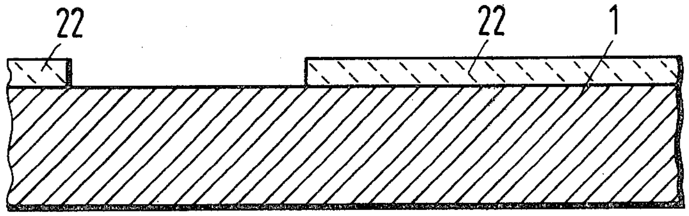
Figure 3:
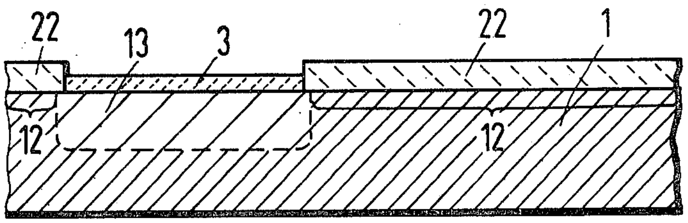

As illustrated in FIG. 1, a monocrystalline body of silicon 1 has formed thereon a pyrolytically deposited silicon nitride layer 2. As shown in FIG. 2, a portion of the silicon nitride layer 2 is removed by any conventional etching technique, leaving a remaining protective covering 22. As shown in FIG. 3, a getter layer is now applied on the exposed surface areas of the silicon body 1, which preferably consists of a layer of thermic silicon oxide. During this oxide production, the getter process takes place. An additional getter processing may be carried out for instance, by means of subsequent tempering. Due to the thermic treatment, impurities are gettered out of the region 13 below the gettering layer 3. This, of course, causes the doping level of the region 13 to be reduced. The silicon below the covering 22 has maintained its original doping and this ungettered region is indicated by the numeral 12.

Figure 4:
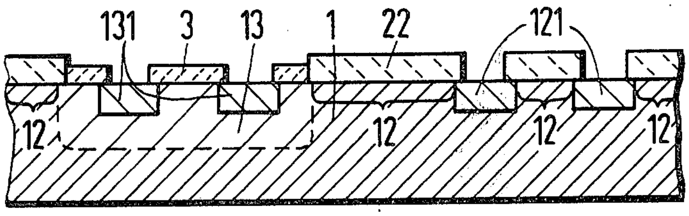
Figure 5:
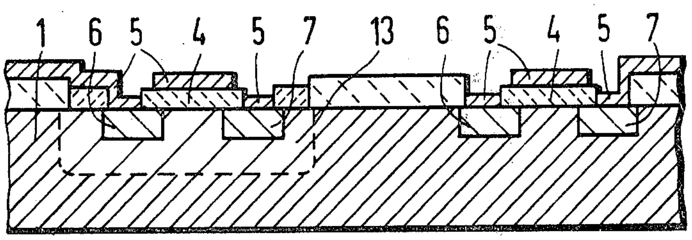

Source and drain regions 131 are formed in the region 13 and source and drain regions 121 are formed in the region 12, as shown in FIG. 4. These source and drain regions may be formed by any well known diffusion technique. Furthermore, these regions are preferably doped oppositely with respect to the areas 13 or 12, thereby to form MOS field effect transistors. The next step is to complete the removal of the getter layer 3 as well as the cover layer 22 in the gate area of each transistor and to form thereon gate insulator layers 4. Electrodes 5 are then applied to the gate insulators 4 and to the source and drain regions 6 and 7 as shown in FIG. 5. The areas 12 and 13 now constitute areas of different doping concentration. The field effect transistors produced in this manner are therefore distinguished by their threshold voltages, or, in the case of identical gate voltage by their conductivity condition. The treshold voltages of the transistors formed in the areas 12 with the higher impurity concentration is greater than the threshold voltage of the transistors which are formed in the areas 13 having the lower concentration of impurities.

Another embodiment of the present invention may be provided by selecting a type of impurities which results after gettering in a "pile up" near the surface of the semiconductor body, where the gettering layer is located. This causes the reverse of the hereinbefore described results to be obtained. That is, higher doped areas developed below the gettered layers rather than lower doped areas being developed. Such a transistor so produced has a high threshold voltage.

In a further emobodiment of the present invention, instead of a solid silicon semiconductor body being employed, a thin semiconductor layer may be used which is formed on an insulating substrate consisting of spinel or sapphire. This has the advantage that the getter effect is increased in comparison to the case with a solid material since due to the small layer thickness of preferably 0.6 to 1.0 $\mu$ m, only a limited number of impurities is present and no impurities can diffucs subsequently from the substrate.

In a related application of the same inventor, filed concurrently herewith, and being identified as Case No. 74,167, assigned to the same assignee as the present invention, a related technique is described. The semiconductor body 1 is not only doped with impurities of only one conductivity type, but also with impurities of the other conductivity type. Concentrations which differ from one another are provided for the donors and acceptors which are comprised in the semiconductor body due to these impurities. For instance, a semiconductor body 1 out of silicon is doped with aluminum acceptors having the concentration $N_A$ and phosphor donors of the concentration $N_D$, whereby the concentration of the acceptors is greater than the concentration of the donors, i.e. $N_A > N_D$. $n_p = N_A - N_D$ applies to the net carrier concentration.

By means of the above described selective gettering, gettered areas may be produced and ungettered areas which comprise donors and acceptors mainly in the original concentrations. Those impurities in the gettered areas which preferably accumulate in the getter layer are decreased in their concentration. Thus, for instance, during the selective gettering of a semiconductor body, such as is stated above, which is p-conductive due to the net carrier concentration and which is doped with aluminum acceptors and phosphor donors, n-conductive areas result below the getter layers since the aluminum impurities accumulate in the getter layer due to the distribution coefficient when using an $SiO_2$ getter layer. Therefore, aluminum impurities of the concentration $N'_A$ and phosphor impurities of the concentration $N'_D$ are contained in the gettered areas after the gettering. Thereby, the concentration $N'_A$ of the aluminum impurities is much smaller according to the invention than the original concentration $N_A$ of the aluminum impurities which was contained in the semiconductor body prior to gettering. The concentration $N'_D$ of the phosphor impurities corresponds essentially to the original concentration $N_D$ of the phosphor impurities contained in the semiconductor body prior to gettering. Therefore, the concentration of the aluminum impurities is much smaller in the gettered areas than the concentration of the phosphor impurity, i.e., $N'_D > N'_A$. Accordingly, this applies for the net carrier concentration after the gettering: $N_n = N'_D - N'_A$.

This enables the production of complementary channel field effect transistors in a semiconductor body.

It will be apparent to those skilled in the art that many modifications and variations may be effected without departing from the spirit and scope of the novel concepts of the present invention.

I claim as my invention:

1. A method for producing an integrated circuit having at least two field effect transistors with different starting potentials which includes taking a semiconductor body which has a predominant doping of one impurity type, gettering one region thereof where one transistor is to be formed to reduce the predominant doping therein, and protecting a second region thereof where a second transistor is to be formed, and forming a field effect transistor in each of said regions in which the channels of the two transistors have the same type impurities but of different concentration.

2. A method for producing an integrated circuit having at least two field effect transistors having different starting potentials which includes starting with a silicon layer having a doping of one impurity type which is to be the type of dopant for the channels of each of the two field effect transistors, covering one surface of said silicon layer with a protective covering which will not getter the impurities from any region lying therebelow, removing a portion of the protective covering where one field effect transistor is to be formed, forming an ungettered region and a gettered region which have the same type impurities by forming a gettering layer over the thus exposed surface, diffusing opposite type impurities in spaced portions of an ungettered region of said silicon layer to form source and drain regions with a channel therebetween to form a first transistor, diffusing opposite type impurities in spaced portions of a gettered region to form source and drain regions with a channel therebetween to form a second transistor, covering the said one surface of said silicon layer with a layer of electrical insulating material, forming source and drain electrodes on said source and drain regions of each field effect transistor, and forming a gate electrode on said insulating layer above each of the channel regions of said field effect transistors.

3. A method according to claim 2, in which said protective covering is silicon nitride.

4. A method according to claim 2, in which said protective covering is pyrolytically deposited silicon nitride.

5. A method according to claim 2, in which said gettering layer is thermically foremed silicon oxide.

6. A method according to claim 2, in which the doping in the silicon layer is boron.

7. A method according to claim 2, in which the doping in the silicon layer is aluminum.

8. A method according to claim 2, in which parts of the protective covering and the gettering layer are used as masks during the diffusion.

* * * * *